US012690398B2

(12) United States Patent
Palacios et al.

(10) Patent No.: US 12,690,398 B2
(45) Date of Patent: Jul. 21, 2026

(54) TRANSISTOR STRUCTURE AND METHODS OF FORMING THE SAME

(71) Applicant: Massachusetts Institute of Technology, Cambridge, MA (US)

(72) Inventors: Tomás A. Palacios, Belmont, MA (US); Qingyun Xie, Cambridge, MA (US); John Prakash Niroula, Los Angeles, CA (US); Pao-Chuan Shih, Taichung City (TW); Gillian Micale, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 18/971,944

(22) Filed: Dec. 6, 2024

(65) Prior Publication Data

US 2026/0165041 A1 Jun. 11, 2026

(51) Int. Cl.
| | |
|---|---|
| H10P 14/20 | (2026.01) |
| H10D 30/01 | (2025.01) |
| H10D 30/47 | (2025.01) |
| H10D 62/824 | (2025.01) |

(Continued)

(52) U.S. Cl.
CPC ....... H10P 14/3416 (2026.01); H10D 30/015 (2025.01); H10D 30/47 (2025.01); H10D 30/471 (2025.01); H10D 30/472 (2025.01); H10D 30/473 (2025.01); H10D 30/4732 (2025.01); H10D 30/4738 (2025.01); H10D 30/474 (2025.01); H10D 30/475 (2025.01); H10D 30/4755 (2025.01); H10D 62/824

(2025.01); H10D 62/8503 (2025.01); H10P 14/2908 (2026.01); H10P 14/3216 (2026.01); H10P 72/74 (2026.01);

(Continued)

(58) Field of Classification Search
CPC ........... H01L 21/0254; H01L 21/02389; H01L 21/02458; H01L 21/6835; H01L 2221/68363; H01L 2924/13064; H10D 62/8503; H10D 30/471; H10D 30/472; H10D 30/473; H10D 30/4732; H10D 30/4738; H10D 30/474; H10D 30/475; H10D 30/4755; H10D 30/015; H10D 30/47; H10D 62/824; H10P 14/3416; H10P 14/2908; H10P 14/3216; H10P 72/74; H10P 72/7424; H10P 72/7426; H10P 72/7432

See application file for complete search history.

(56) References Cited

U.S. PATENT DOCUMENTS

| | | | | |
|---|---|---|---|---|
| 2014/0264379 A1* | 9/2014 | Kub | ................... | H10D 62/8503 257/77 |
| 2020/0273974 A1* | 8/2020 | Guidry | ................. | H10D 62/117 |

(Continued)

*Primary Examiner* — Aaron J Gray
(74) *Attorney, Agent, or Firm* — Stanek Lemon Crouse & Meeks, PA

(57) ABSTRACT

Provided is an epitaxial design/structure and transistor platform for a III-N transistor/chip incorporating a backside conductive/metal layer. The backside metal may serve several functions in the transistor/chip, including serving as a back gate, a field plate, and an electrode to deliver power to the devices and circuits, for example, as part of a backside power delivery network (BSPDN). Also provided are methods of preparing/fabricating the epitaxial design/structure and transistor platform described herein.

13 Claims, 23 Drawing Sheets

(51) Int. Cl.
    H10D 62/85          (2025.01)
    H10P 72/70          (2026.01)

(52) U.S. Cl.
    CPC ...... H10P 72/7424 (2026.01); H10P 72/7426
         (2026.01); *H10P 72/7432* (2026.01)

(56)               References Cited

U.S. PATENT DOCUMENTS

2021/0082911 A1*   3/2021   Chiu ...................... H10D 84/05
2023/0402525 A1*  12/2023   Li ......................... H10D 62/10

* cited by examiner

FIG. 1

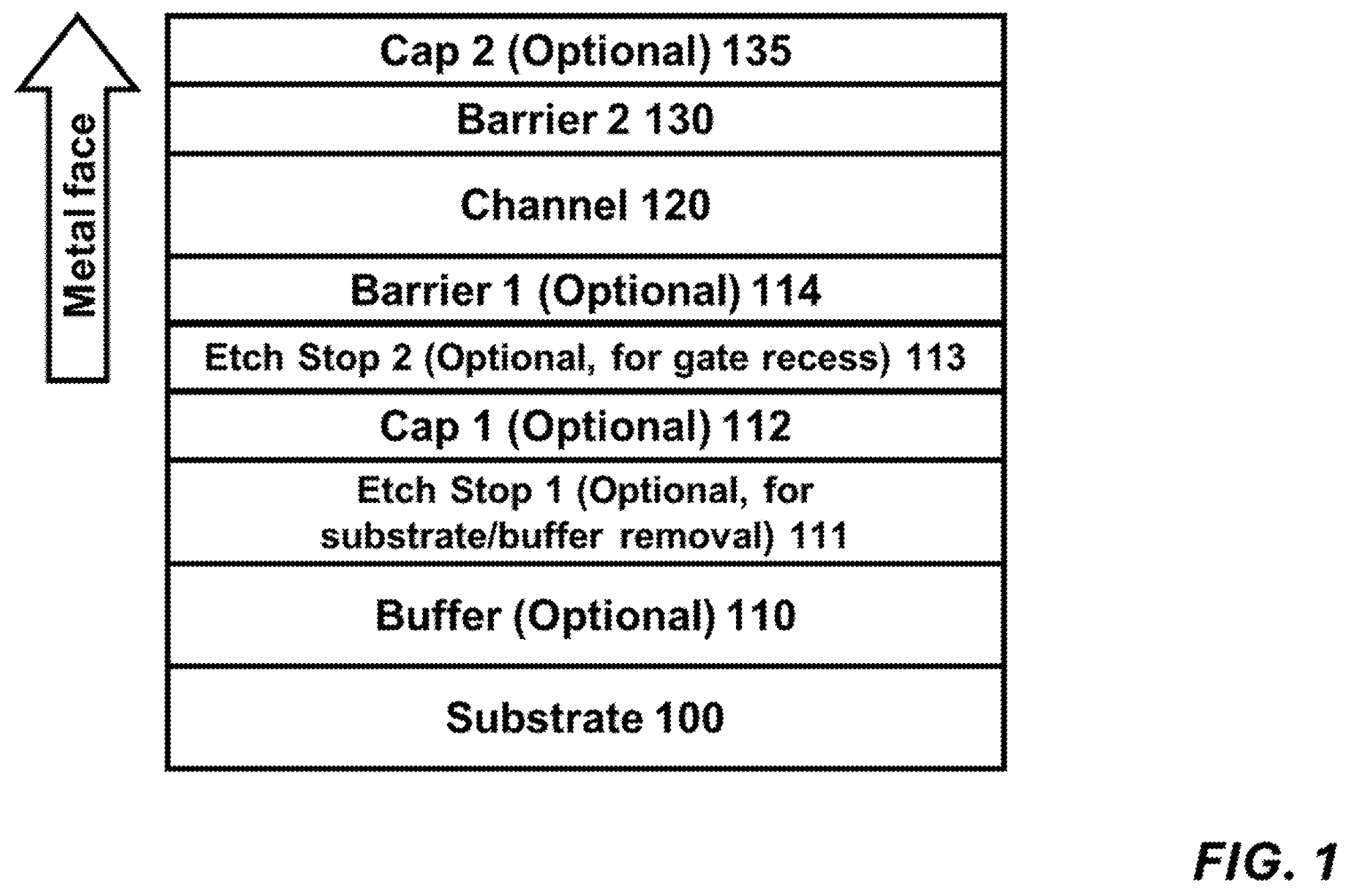

Cap 2 (Optional) 135

Barrier 2 130

Channel 120

Barrier 1 (Optional) 114

Etch Stop 2 (Optional, for gate recess) 113

Cap 1 (Optional) 112

Etch Stop 1 (Optional, for substrate/buffer removal) 111

Buffer (Optional) 110

Substrate 100

Metal face

Buffer 110

Substrate 100

Figure 6:
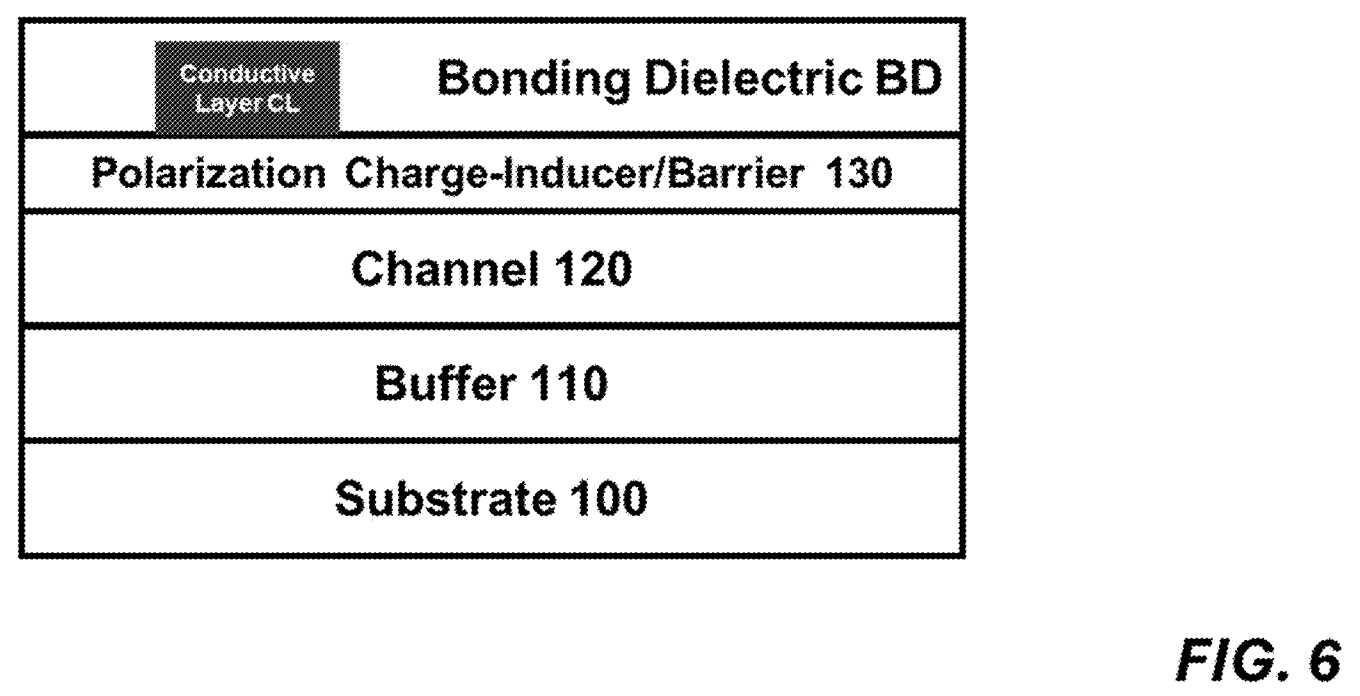

Conductive Layer CL

Bonding Dielectric BD

Polarization Charge-Inducer/Barrier 130

Channel 120

Buffer 110

Substrate 100

*FIG. 13*

| |
|---|
| Etch Stop 2 113 |
| Cap 1 112 |
| Etch Stop 1 111 |
| Buffer 110 |
| Substrate 100 |

Barrier 1 114

Etch Stop 2 113

Cap 1 112

Etch Stop 1 111

Buffer 110

Substrate 100

*FIG. 14*

Channel 120

Barrier 1 114

Etch Stop 2 113

Cap 1 112

Etch Stop 1 111

Buffer 110

Substrate 100

| |
|---|
| Barrier 2 130 |
| Channel 120 |
| Barrier 1 114 |
| Etch Stop 2 113 |
| Cap 1 112 |
| Etch Stop 1 111 |
| Buffer 110 |
| Substrate 100 |

| |
|---|
| Cap 2 135 |
| Barrier 2 130 |
| Channel 120 |
| Barrier 1 114 |
| Etch Stop 2 113 |
| Cap 1 112 |
| Etch Stop 1 111 |
| Buffer 110 |
| Substrate 100 |

← Metal face

FIG. 18

Conductive Layer CL

| Cap 2 135 |
| Barrier 2 130 |
| Channel 120 |
| Barrier 1 114 |
| Etch Stop 2 113 |
| Cap 1 112 |
| Etch Stop 1 111 |
| Buffer 110 |
| Substrate 100 |

FIG. 19

| |
|---|
| Bonding Dielectric BD |
| Conductive Layer CL |
| Cap 2 135 |
| Barrier 2 130 |
| Channel 120 |
| Barrier 1 114 |
| Etch Stop 2 113 |
| Cap 1 112 |
| Etch Stop 1 111 |
| Buffer 110 |
| Substrate 100 |

2001

TRANSISTOR STRUCTURE AND METHODS OF FORMING THE SAME

FIELD

This inventive concept relates to an epitaxial design and transistor structure for a Group III Nitride (III-N) transistor/chip incorporating a backside conductive layer. This backside conductive layer, e.g., a backside metal layer, may serve several functions in the transistor/chip, including a back gate, and/or a backside power delivery network (BSPDN).

BACKGROUND

The dual-back-gate III-N transistor is projected to be capable of delivering high power at very high frequencies (sub-terahertz regime). Metal-polar III-N transistors have been at the forefront of high power, high frequency technology. The traditional approach to scaling these high electron mobility transistors (HEMTs) for operation at higher frequencies (mm-wave and beyond) is aggressive gate length scaling. However, to maintain a high enough ratio of gate length to gate-channel distance (implying the degree of electrostatic control of the gate over the channel), the barrier in the HEMT epitaxy needs to be thinned. A poor gate control results in short-channel effects, as reflected in the high output conductance in the saturation regime. A back gate may be desirable for improving the gate control of the channel (for the same gate length). This back gate needs to be sufficiently close to the channel (from underneath), therefore complementing the electrostatic control of the conventional gate (in this context, a "top gate").

Another application for a backside conductive layer is to provide backside power routing to enable a BSPDN on a III-N platform, therefore advancing chip scaling for III-N integrated circuits and more efficient top metal routings.

Given that III-N epitaxial layers are grown on a substrate, it is not straightforward to "insert" a backside conductive layer in the middle of an epitaxial structure using conventional top-down device fabrication. Therefore, there remains a need for novel epitaxial structures to accommodate a backside conductive layer using wafer-bonding technology. With such novel epitaxial structures, novel transistors can be formed.

SUMMARY

According to an aspect of the inventive concept, provided is an epitaxial structure. The structure may include at least one epitaxial layer, and may include (from the bottom up): a substrate; optionally, a III-N buffer layer; optionally, a first, for substrate and/or buffer removal, etch stop layer; optionally, a first cap layer; optionally, a second, for gate recess, etch stop layer; optionally, a first polarization charge-inducer/barrier layer; a channel; a polarization charge-inducer/(second) barrier layer; and optionally, a second cap layer. In some aspects, the epitaxial structure may have all of the optionally present layers, any combination of some of (2, 3, 4, or 5) the optionally present layers, any one of the optionally present layers, or none of the optionally present layers. In some aspects, any one, at least one, i.e., one or any combination of some, or all of the layers are formed/deposited/prepared epitaxially.

According to another aspect of the inventive concept, provided is a transistor platform. The transistor platform may include an epitaxial structure, such as the epitaxial structure of the inventive concept as described above, including: a source electrode and a drain electrode located on opposing sides of the channel, a gate electrode located on top of the channel, and a backside metal/conductive layer at a location anywhere below the channel. This backside metal/conductive layer may have different roles, including functioning as a back gate, a field plate, and an electrode to deliver power to the devices and circuits, e.g., a backside power delivery network (BSPDN).

According to yet another aspect of the inventive concept, provided is method of forming a transistor platform, such as a high-electron-mobility transistor (HEMT). The method may include: depositing and patterning a conductive layer (e.g., a metal layer) on top of an epitaxial structure, such as the structure of the inventive concept as described above; and removing the substrate and/or buffer. In some aspects, prior to the substrate removal, the following may be performed: (i) depositing a bonding dielectric (e.g., $SiO_2$) on top of the epitaxial structure; (ii) flipping the epitaxial structure such at the end of the flip, the metal face (e.g., Ga face in GaN) is at the bottom, whereas the nitrogen face is at the top; and (iii) bonding the bonding dielectric to a mechanical wafer (e.g., Si). In some aspects of the inventive concept, (ii) is performed before (iii). In some aspects of the inventive concept, (iii) is performed prior to (ii). In still other aspects of the inventive concept, source and drain electrodes may be formed on opposite sides of the channel, and a gate electrode may be formed on the top of the channel by processing the top of the flipped epitaxial structure (bottom of the original epitaxial structure).

BRIEF DESCRIPTION OF THE DRAWINGS

FIG. 1 illustrates an exemplary embodiment of an epitaxial structure of the inventive concept, grown on a substrate, which includes III-N layers grown in the metal polar direction.

FIG. 2 depicts a buffer layer formed on a substrate according to some embodiments of the inventive concept.

FIG. 5 depicts a patterned conductive layer formed on the polarization charge-inducer/barrier layer according to some embodiments of the inventive concept.

FIG. 6 depicts a bonding dielectric deposited on the gate recess/conductive layer and patterned conductive layer according to some embodiments of the inventive concept.

FIG. 13 depicts an optional second etch stop layer formed on the first cap layer/on the first etch stop layer/on the buffer layer according to further embodiments of the inventive concept.

FIG. 14 depicts an optional first polarization charge-inducer/barrier layer formed on the second etch stop layer/on the first cap layer/on the first etch stop layer/on the buffer layer according to further embodiments of the inventive concept.

FIG. 15 depicts a channel formed on the optional first polarization charge-inducer/barrier layer/on the optional second etch stop layer/on the optional first cap layer/on the buffer layer according to further embodiments of the inventive concept.

FIG. 16 depicts a second polarization charge-inducer/barrier layer for gate recess formed on the channel according to further embodiments of the inventive concept.

FIG. 17 depicts an optional second cap layer formed on the second polarization charge-inducer/barrier layer to provide another epitaxial structure according to further embodiments of the inventive concept.

FIG. 18 depicts a conductive layer formed and patterned on the second cap layer/on the second polarization charge-inducer/barrier layer on the structure according to further embodiments of the inventive concept.

FIG. 19 depicts a bonding dielectric deposited on the second cap layer/conductive layer formed on the structure according to further embodiments of the inventive concept.

DETAILED DESCRIPTION

Figure 3:
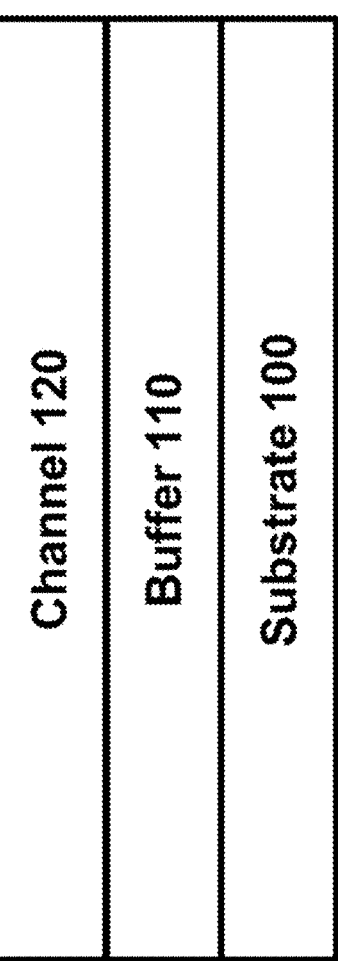
FIG. 3 depicts a channel formed on the buffer layer according to some embodiments of the inventive concept.

The foregoing and further aspects of the present inventive concept will now be described in more detail with respect to other embodiments described herein. It should be appreciated that the inventive concept can be embodied in different forms and should not be construed as limited to the embodiments set forth herein. Rather, these embodiments are provided so that this disclosure will be thorough and complete, and will fully convey the scope of the inventive concept to those skilled in the art.

It will be understood that, although the terms "first," "second," "a)," "b)," etc. may be used herein to describe various elements, these elements should not be limited by these terms. These terms are only used to distinguish one element from another element. Thus, for example, a first element, a first component or a first section discussed herein could be termed a second element, a second component or a second section in some embodiments without departing from the teachings of the present inventive concept.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (i.e., "between" versus "directly between", "adjacent" versus "directly adjacent", etc.). It will also be understood that the sizes and relative orientations of the illustrated elements are not necessarily shown to scale, and in some instances, the elements have been exaggerated for purposes of explanation.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

The term "comprise," as used herein, in addition to its regular meaning, may also include, and, in some embodiments, may specifically refer to the expressions "consist essentially of" and/or "consist of." Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of," i.e., wherein that which is claimed may include further elements that do not materially affect the basic and novel characteristic(s) of that which is claimed.

The term "about" is intended to qualify the numerical values which it modifies, denoting such a value as variable within a margin of error. When no particular margin of error, such as a standard deviation to a mean value given in a chart or table of data, is recited, the term "about" should be understood to mean that range which may encompass, for example, ±20%, ±15%, or ±10%, and in some embodiments, ±5%, ±3%, ±2%, or ±1% of the recited value and the range is included.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the inventive concept will be explained in further detail with reference to the accompanying drawings.

Table 1 depicts exemplary components/layers that may be included in an epitaxial structure according to some embodiments of the inventive concept. Layers may be grown in the direction of the metal face/metal polar direction on top of the substrate

TABLE 1

Layers of an exemplary epitaxial structure grown on a substrate.

| | Layer name | Remarks | Material specifications* |
|---|---|---|---|
| Metal face ↑ | Cap 2 | Optional | SiN or GaN |
| | Barrier 2 | | $Al_xGa_{1-x}N$, x > 0.1, thickness > 1 nm |
| | Channel | | GaN |
| | Barrier 1 | Optional | $Al_xGa_{1-x}N$, x > 0.1, thickness > 1 nm |
| | Etch stop 2 | Optional, for gate recess | $Al_xGa_{1-x}N$, x > 0.1, thickness > 1 nm |
| | Cap 1 | Optional | GaN |
| | Etch stop 1 | Optional, for substrate removal | $Al_xGa_{1-x}N$, x > 0.1, thickness > 1 nm |
| | Buffer | Optional | III-N super lattice or other |
| | Substrate | | Si, SiC, sapphire or GaN |

*Exemplary, for illustrative purposes only, non-exhaustive.

FIGS. 1-10 illustrate a method of fabricating an epitaxial structure and completed device structure/transistor platform at various stages according to some embodiments of the inventive concept.

Referring to FIG. 1, an epitaxial structure of the inventive concept may include: a substrate 100; a buffer layer 110 on the substrate 100; an optional first etch stop layer 111, for example, for substrate/buffer removal, an optional first cap layer 112, an optional second etch stop layer 113, for example, for formation of a gate/top gate recess, and an optional first barrier layer 114 may be stacked on the buffer layer 110 and substrate 100; a channel 120 on the buffer layer 110 and substrate 100, and any intervening layers present; a second barrier layer 130, for example, that may serve as polarization charge-inducer, on the channel 120; and an optional second cap layer 135. In some embodiments, the epitaxial structure of the inventive concept may have all of the optional layers present, any combination of some of (2, 3, 4, or 5) the optional layers present, any one of the optional layers present, or none of the optional layers present.

In some embodiments, the layers of the epitaxial structure may be stacked/formed on any suitable substrate 100, including, but not limited to, a semiconductor substrate, e.g., silicon (Si), silicon carbide (SiC), sapphire, or gallium nitride (GaN). According to some embodiments, the buffer layer 110 may be any suitable material including, but not limited to, a group III-N super lattice or the like.

In some embodiments, the optional etch stop layers 111 and 113 of the epitaxial structure may be of a, for example, a III-N material, e.g., but not limited to, an AlGaN material, such as $Al_xGa_{1-x}N$, wherein x>about 0.1. In some embodiments, the optional barrier layer 114 of the epitaxial structure may be of a, for example, a III-N material, e.g., but not limited to, an AlGaN material, such as $Al_xGa_{1-x}N$, wherein x>about 0.1. In some embodiments, the optional cap layers 112 and 135 may be of a, for example, a III-N material, e.g., but not limited to, GaN. In some embodiments, the second cap layer 135 may be of GaN or SiN.

The channel 120 of the epitaxial structure of the inventive concept may be of any material that would be appreciated by one of skill in the art that would be suitable for a channel of a transistor structure. In some embodiments, the channel 120 of the epitaxial structure may include a III-N material, for example, but not limited to, GaN. The barrier layer 130, referred to as a second barrier layer in some embodiments of the inventive concept as described herein, may also be of any suitable material that would be suitable for a barrier of a transistor platform. In some embodiments, the barrier layer 130 may include a III-N material, e.g., but not limited to, an AlGaN material, such as $Al_xGa_{1-x}N$, wherein x>about 0.1.

The layers in the epitaxial structure/transistor platform of the inventive concept may be formed using any suitable method known in the art. In some embodiments, the layers may be formed using processes including, but not limited to the following deposition processes, e.g., metal-organic chemical vapor deposition (MOCVD), molecular beam epitaxy (MBE), atomic layer deposition (ALD), and sputtering processes. In some embodiments, the layers may be formed using epitaxial growth processes, e.g., epitaxial growth processes wherein the substrate 100, or any layer of the structure, may act as a seed layer for epitaxial growth of a layer formed thereon. In some embodiments, a resulting layer formed on a substrate and/or another layer may have a single crystalline structure. In some embodiments, a layer and/or the layers of the epitaxial structure/transistor platform may include a III-N material, such as gallium nitride (GaN), aluminum gallium nitride (AlGaN), and the like. In some embodiments, one layer of the structure is grown/prepared epitaxially. In some embodiments, at least one, i.e., one or any combination of some of the layers are grown/prepared epitaxially. In some embodiments, all the layers of the structure are grown/prepared epitaxially.

Moreover, the layers in the epitaxial structure/transistor platform of the inventive concept may be of any suitable dimension/thickness that would be appreciated by one of skill in the art that would be requisite for the structure/platform. Although depicted as planar layers in the drawings, any layer of the structure/platform may be nonplanar, for example, including openings, and layers of the structure/platform of the inventive concept may be formed in such openings, and conform to the contours of such openings in a layer.

Figure 2:
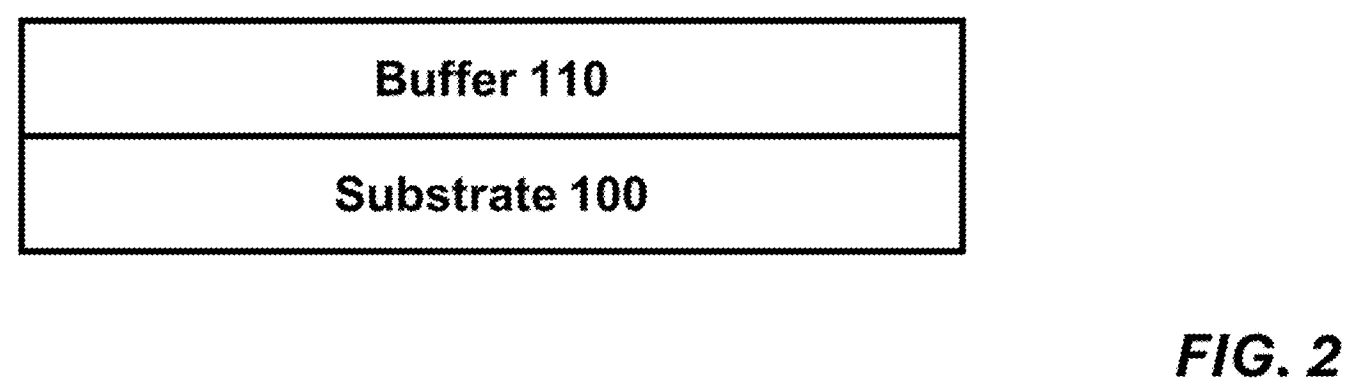
Figure 4:
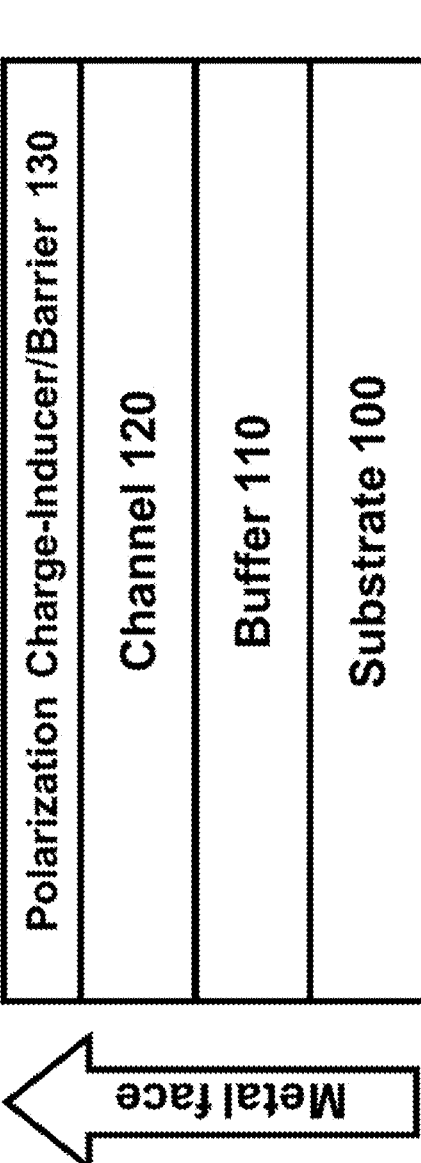
FIG. 4 depicts a polarization charge-inducer/barrier layer formed on the channel to provide an epitaxial structure according to some embodiments of the inventive concept.

Referring to FIGS. 2-4, a method of fabricating an epitaxial structure according to some embodiments of the inventive concept, layers grown on top of the substrate 100 in the metal face (top face) may include forming a buffer layer 110 on a substrate 100, as shown in FIG. 2. A channel 120 may then be formed on the buffer layer 110, as shown in FIG. 3, followed by forming a polarization charge-inducer/barrier layer 130 on the channel 120, as shown in FIG. 4, to provide an epitaxial structure 1000. The layers in the structure may be III-N layers grown in the metal polar direction, on the metal face up from the substrate. The polarization charge-inducer/barrier layer may give rise to a quantum well at the interface of the polarization charge-inducer and the channel, and where the quantum well is populated with charge carriers.

Figure 5:
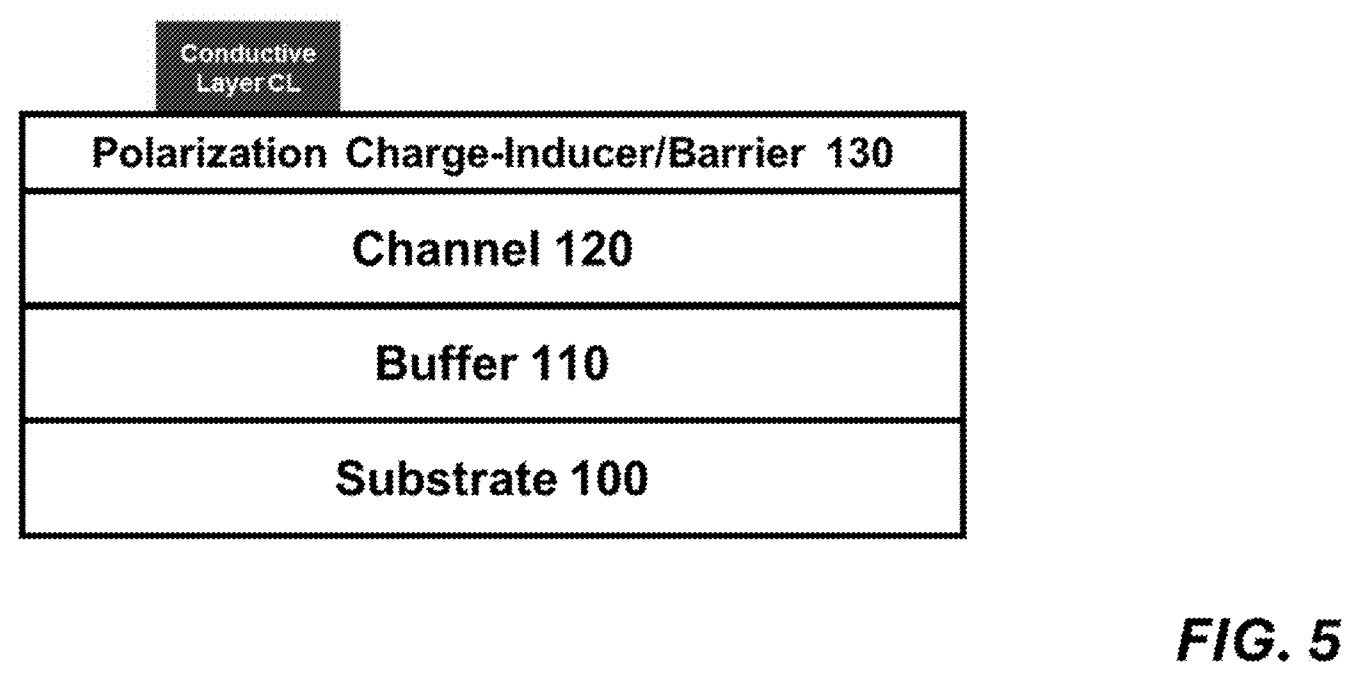

Referring to FIGS. 5-10, a method of fabricating a transistor platform of the inventive concept may include forming a conductive layer (CL) on top of the epitaxial structure, for example, on the charge-inducer/barrier layer 130, as shown in FIG. 5. The resulting conductive layer CL deposited may be patterned at the top of the original epitaxial structure. The material of the CL is not particularly limited, and the CL may be of any material that would be appreciated by one of skill in the art that is suitable for forming a conductive layer. In some embodiments, the CL may be a metal layer/may include a metal.

Following formation/patterning of the CL, the substrate 100 and/or buffer layer 110 may be removed. The method of removing the substrate/buffer is not particularly limited (e.g., wet etching, reactive ion etching), and any method that would be appreciated by one of skill in the art may be used without departing from the scope of the inventive concept.

Figure 7:
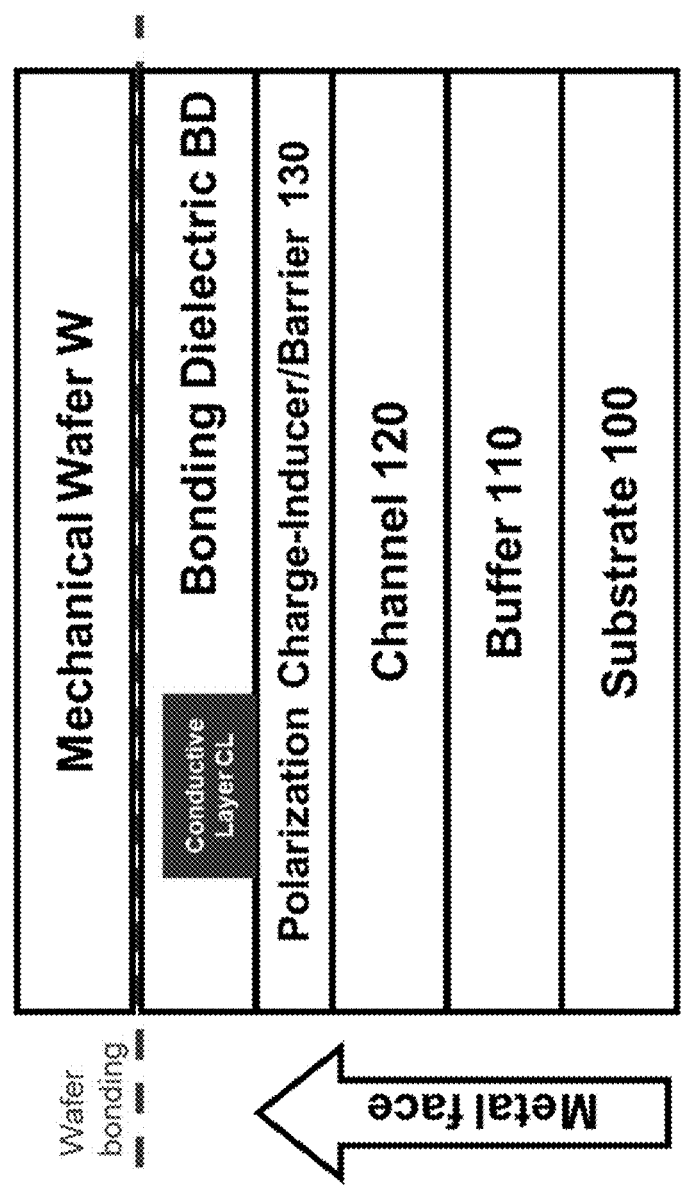
FIG. 7 depicts bonding of a mechanical wafer to the bonding dielectric according to some embodiments of the inventive concept.
Figure 8:
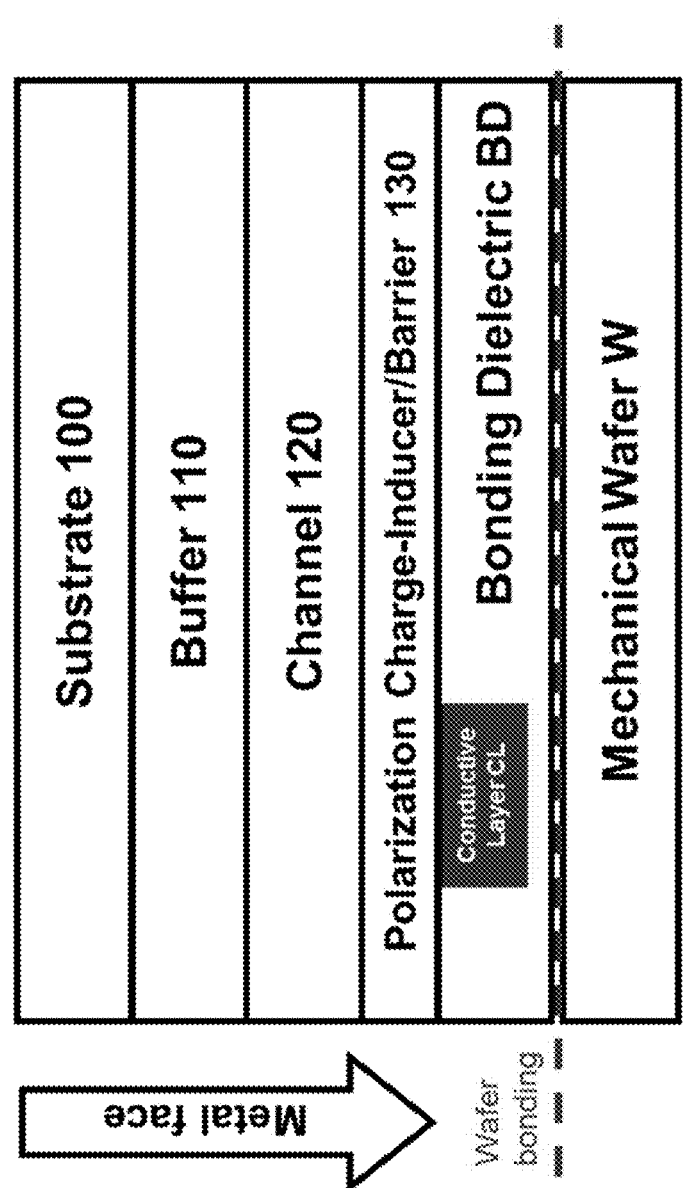
FIG. 8 depicts flipping of the structure according to some embodiments of the inventive concept. Following flipping, the substrate, which was at the bottom of the structure, is now at that top of the structure.

Prior to removal of the substrate/buffer, in some embodiments, a bonding dielectric (BD) may then be formed/deposited on the top of the epitaxial structure/CL, as shown in FIG. 6. The bonding dielectric may be of any material that would be appreciated by one of skill in the art. The bonding dielectric may cover the polarization charge-inducer/barrier layer 130 and the CL. Following formation/deposition of the bonding dielectric, a mechanical wafer W, e.g., a wafer of silicon, may be bonded to the BD, as shown in FIG. 7. Following bonding of the wafer W to the BD, the structure may be flipped, such that the mechanical wafer W, BD, and CL are now at the bottom of the structure, beneath the channel 120, for example, as shown in FIG. 8. Alternatively, in some embodiments, the structure shown in FIG. 6 may be flipped, such that the bonding dielectric BD is now at the bottom of the structure, and prior to bonding of the mechanical wafer W to the BD. After flipping of the structure, the mechanical wafer W may now be bonded to the BD, to provide the structure shown in FIG. 8.

Figure 9:
FIG. 9 depicts the structure after substrate/buffer removal according to some embodiments of the inventive concept.
Figure 10:
FIG. 10 depicts a transistor/top gate formed on, and source and drain electrodes extending into the channel by processing the top of the flipped epitaxial structure (bottom of the original epitaxial structure) to provide a transistor platform according to some embodiments of the inventive concept.
Figure 10:
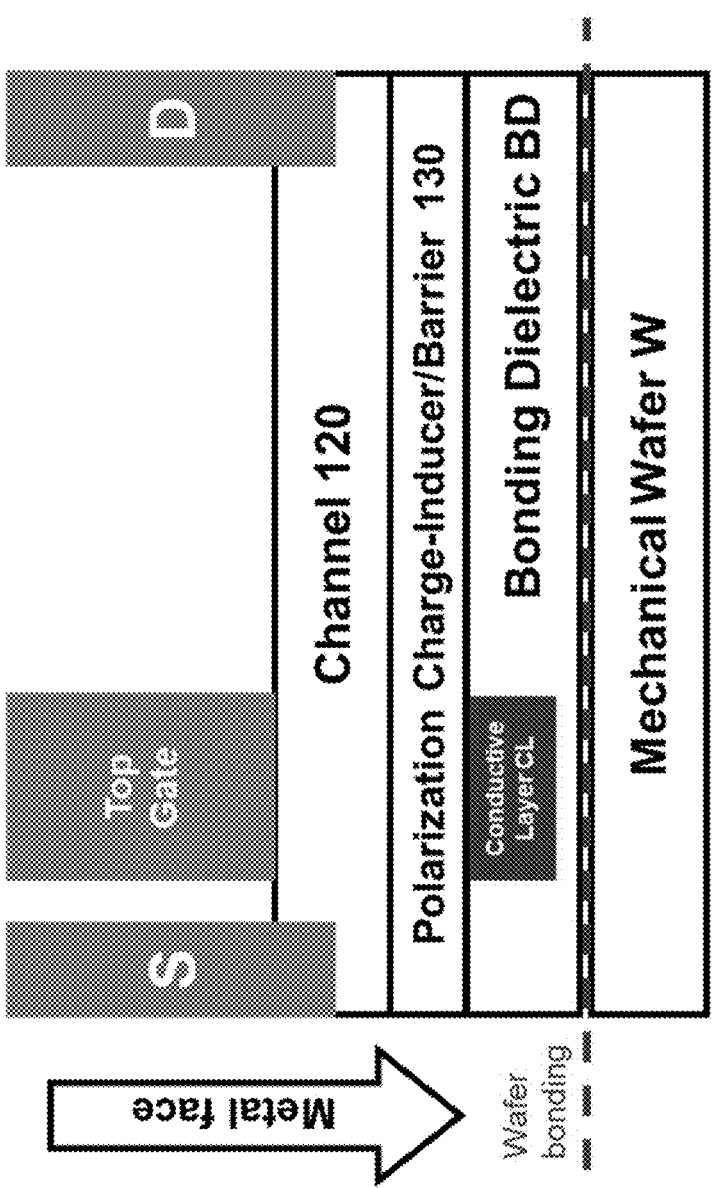

Following removal of the substrate buffer from the structure shown in FIG. 8, a structure as shown in FIG. 9 is provided. Source and drain electrodes, (S and D, respectively), may be formed on opposing sides of the channel 120, and a gate electrode/top gate may be formed at the top of the channel to provide a structure/transistor platform 1001 shown in FIG. 10. The CL may now serve as a backside metal below the channel as a result of flipping the structure, and may serve in different roles, for example, as a backgate, a field plate, and an electrode to deliver power to the devices and circuits, e.g., part of a backside power delivery network (BSPDN).

Figure 11:
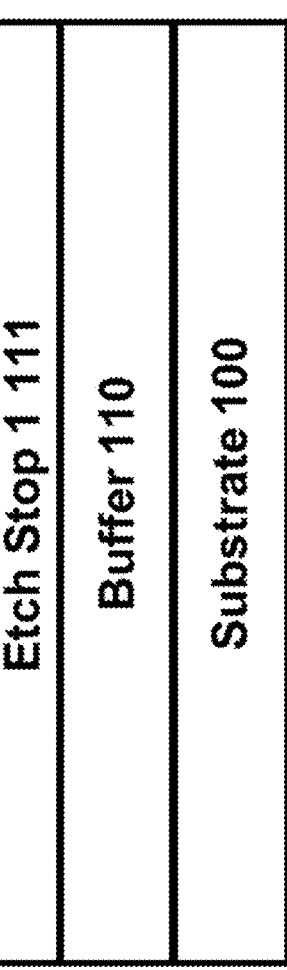
FIG. 11 depicts an optional first etch stop layer formed on the buffer layer of the structure in FIG. 2 according to further embodiments of the inventive concept.
Figure 12:
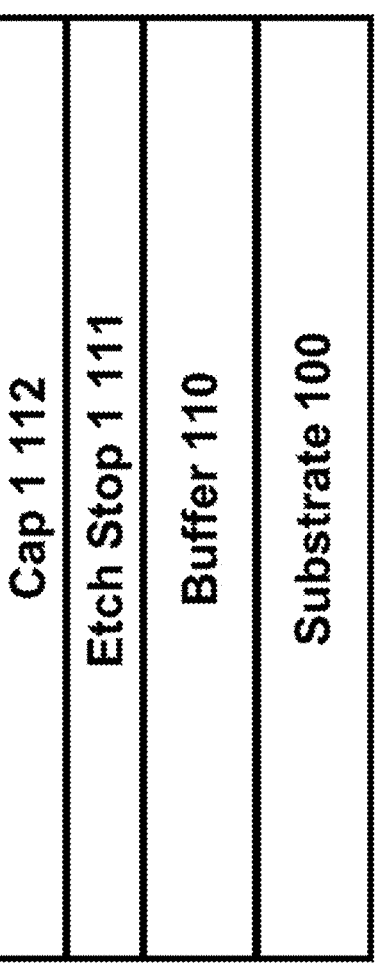
FIG. 12 depicts an optional first cap layer formed on the first etch stop layer/on the buffer layer according to further embodiments of the inventive concept.
Figure 14:
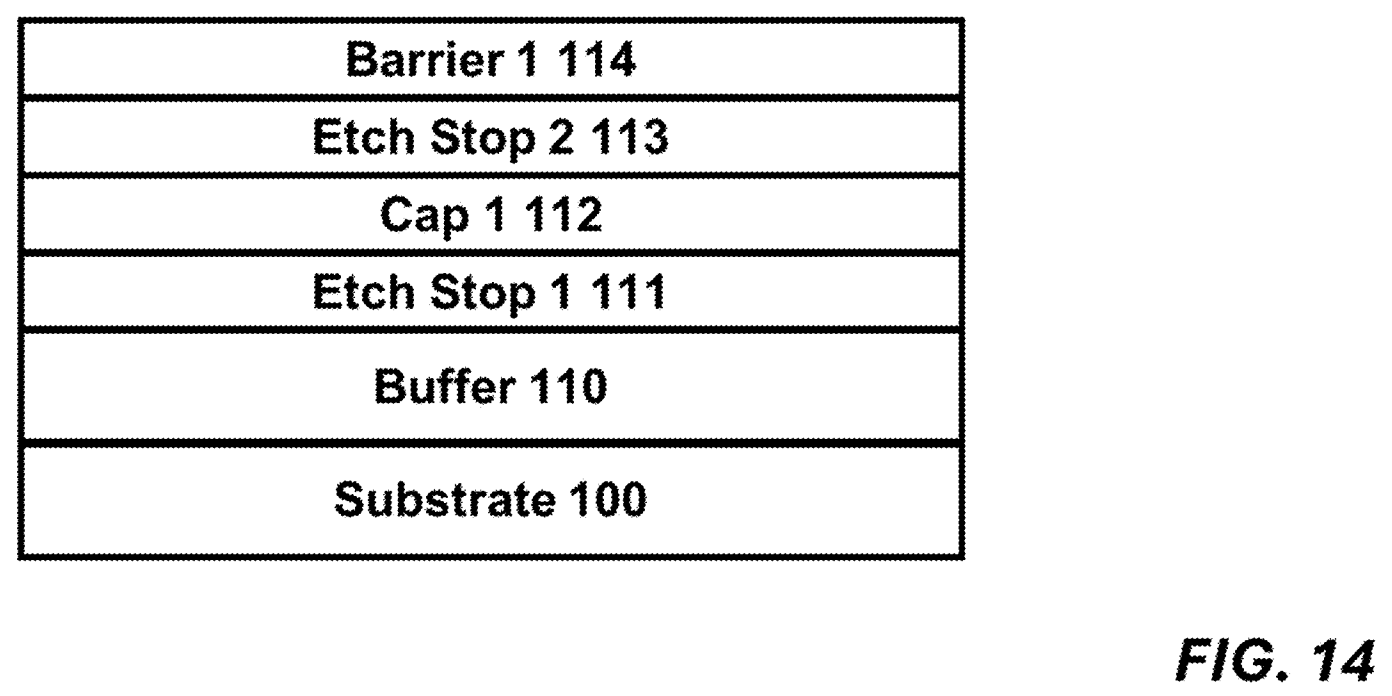
Figure 15:
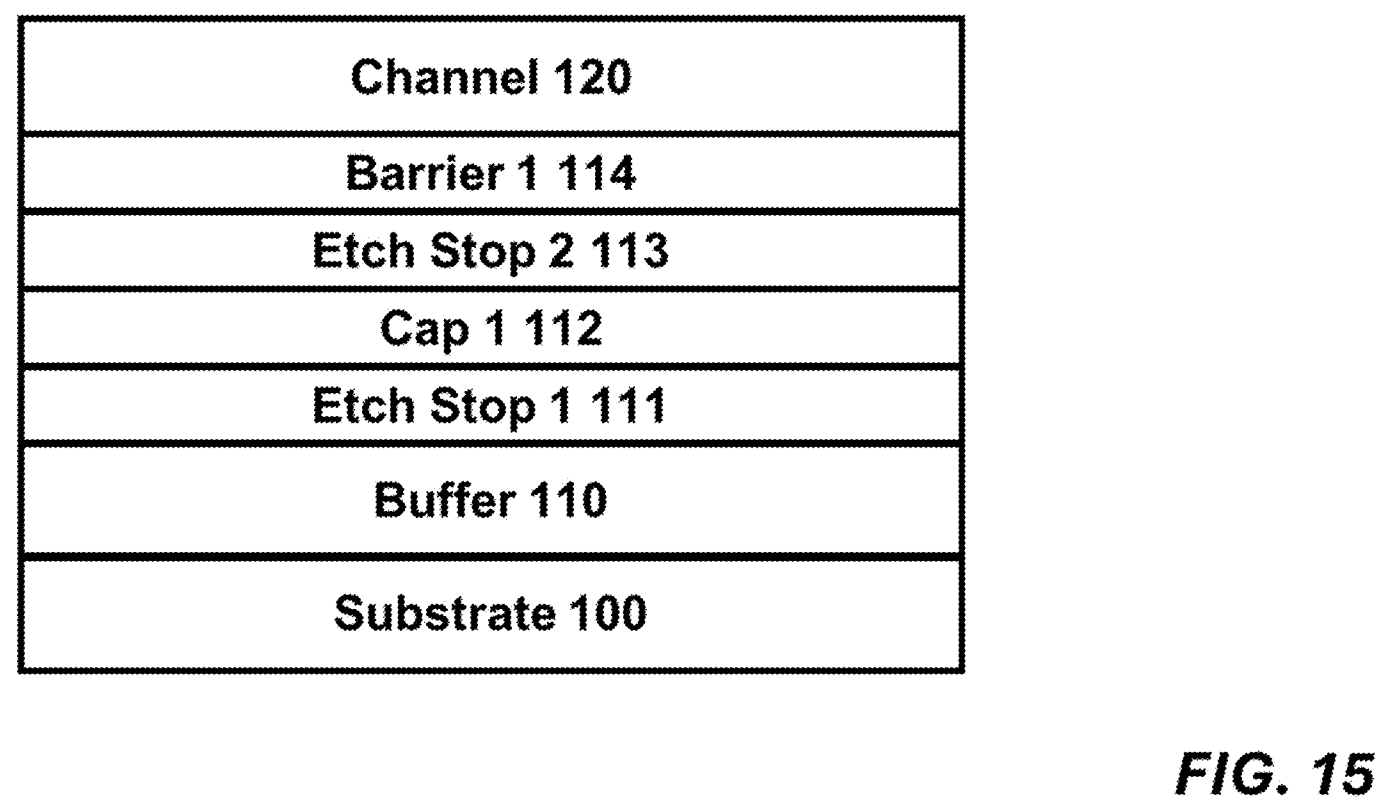
Figure 16:
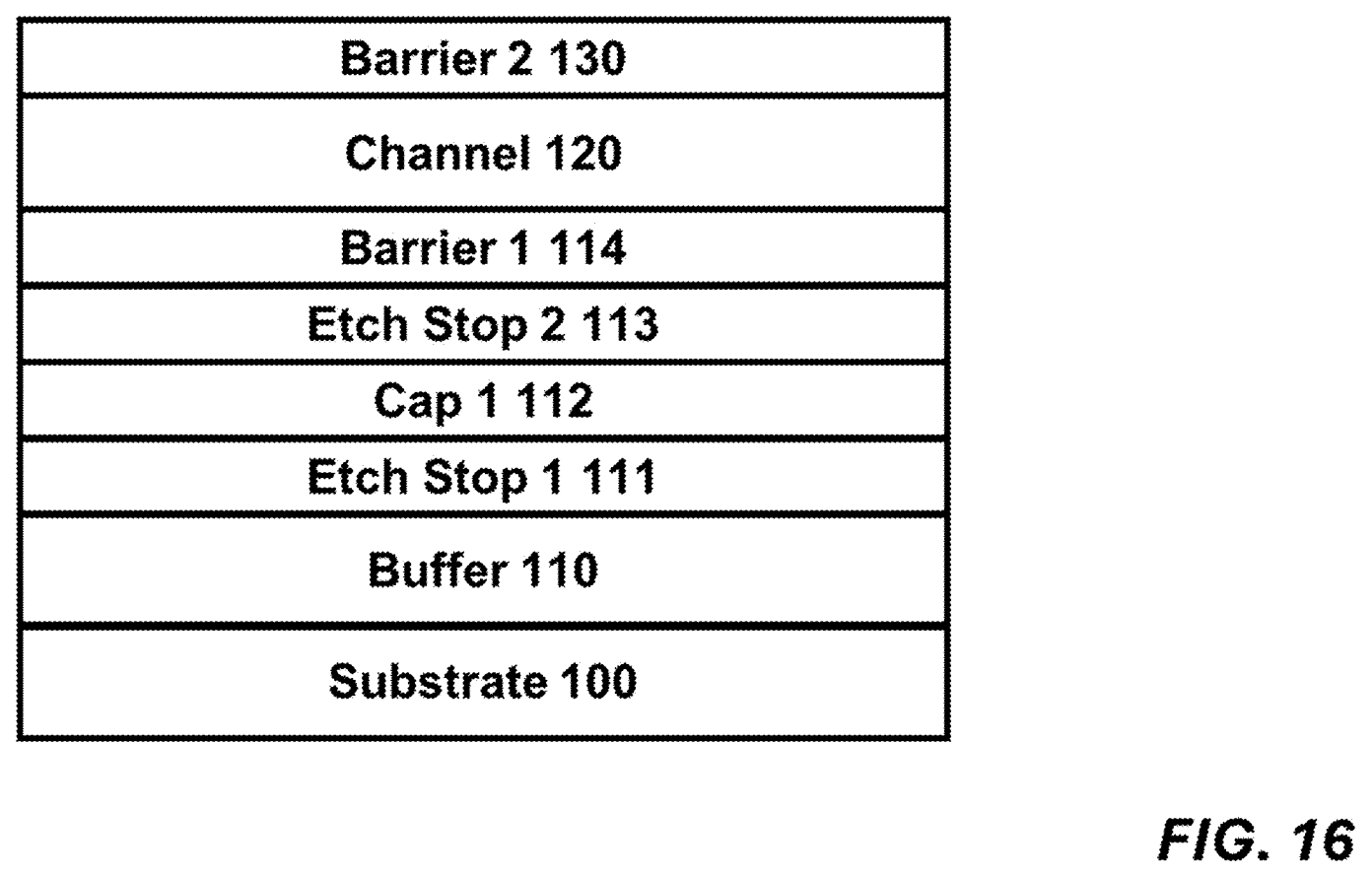

Referring to FIGS. 11-17, a method of fabricating an epitaxial structure according to other embodiments of the inventive concept may include forming a first etch stop layer 111 grown on the buffer layer 110 on a substrate 100 (e.g., as shown in FIG. 2), as shown in FIG. 11. A first cap layer 112 may then be formed on the first etch stop layer 111, as shown in FIG. 12. A second etch stop layer 113 may then be formed on the first cap layer 112, as shown in FIG. 13. A first polarization charge-inducer/barrier layer 114 may then be formed on the second etch stop layer 113, as shown in FIG. 14. The channel 120 may then be formed on the first polarization charge-inducer/barrier layer 114, as shown in FIG. 15, followed by forming a second polarization charge-inducer/barrier layer 130 on the channel 120, as shown in FIG. 16. A second cap layer 135 may then be formed on the second polarization charge-inducer/barrier layer 130, as shown in FIG. 17, to provide the epitaxial structure 2000. The layers in the structure may be III-N layers grown in the metal polar direction, on the metal face up from the substrate. The polarization charge-inducer/barrier layer(s) may give rise to a quantum well at the interface of the polarization charge-inducer and the channel, and where the quantum well is populated with charge carriers. It will be appreciated that first etch stop layer 111, first cap layer 112, second etch stop layer 113, first polarization charge-inducer/barrier layer 114, and second cap layer 135 are optionally present the epitaxial structure according to some embodiments of the inventive concept. As such, in some embodiments, all of these elements are present in the epitaxial structure of the inventive concept. In some embodiments, all of these elements are absent, for example, as shown in FIGS. 2-4. In some embodiments, any combination of some of (2, 3, 4, or 5) the optional elements are present in the epitaxial structure of the inventive concept. In some embodiments, any one of the optional elements are present in the epitaxial structure of the inventive concept.

In some embodiments, the first polarization charge-inducer/barrier layer 114 and the channel 120 are of distinct III-N semiconductor materials, including alloys. In some embodiments, the first charge-inducer/barrier layer 114 may include, e.g., an AlGaN material, such as $Al_xGa_{1-x}N$, wherein x>about 0.1. In some embodiments, the second polarization charge-inducer/barrier layer 130 and the channel 120 are of distinct III-N semiconductor materials, including alloys, wherein the second polarization charge-inducer/barrier layer 130 has a band gap greater than/wider than that of the band gap of the channel 120. In some embodiments, the second charge-inducer/barrier layer 130 may include, e.g., an AlGaN material, such as $Al_xGa_{1-x}N$, wherein x>about 0.1. In some embodiments, the first cap layer 112 includes a material that is the same material/with the same alloy composition as the channel 120. In some embodiments, the material of the first cap layer 112 and the channel 120 may include, e.g., GaN. In some embodiments, the second cap layer 135 includes any III-N semiconductor material, e.g., GaN, or includes silicon nitride (SiN). In some embodiments, the first etch stop layer 111 is of a material that is minimally etched compared to the material of the substrate 100 and/or buffer layer 110, such as, but not limited to, $Al_aGa_{1-a}N$, wherein the mole fraction a of Al is 0<a≤1. In some embodiments, the second etch stop layer 113 is of a material that is minimally etched compared to the material of the first cap layer 112, such as, but not limited to, $Al_bGa_{1-b}N$, wherein the mole fraction b of Al is $0<b\leq1$.

Referring to FIGS. 18-23, a method of fabricating a transistor platform according to other embodiments of the inventive concept may include forming a conductive layer CL on top of the epitaxial structure, for example, on the second cap layer 135, as shown in FIG. 18. The resulting conductive layer CL deposited may be patterned at the top of the original epitaxial structure. The material of the conductive layer CL is not particularly limited, and the conductive layer CL may be of any material that would be appreciated by one of skill in the art that is suitable for forming a conductive layer. In some embodiments, the conductive layer CL may be a metal layer/may include a metal.

Following formation/patterning of the conductive layer CL, the substrate 100 and/or buffer layer 110 may be removed. The method of removing the substrate/buffer is not particularly limited (e.g., wet etching, reactive ion etching), and any method that would be appreciated by one of skill in the art may be used without departing from the scope of the inventive concept.

Figure 20:
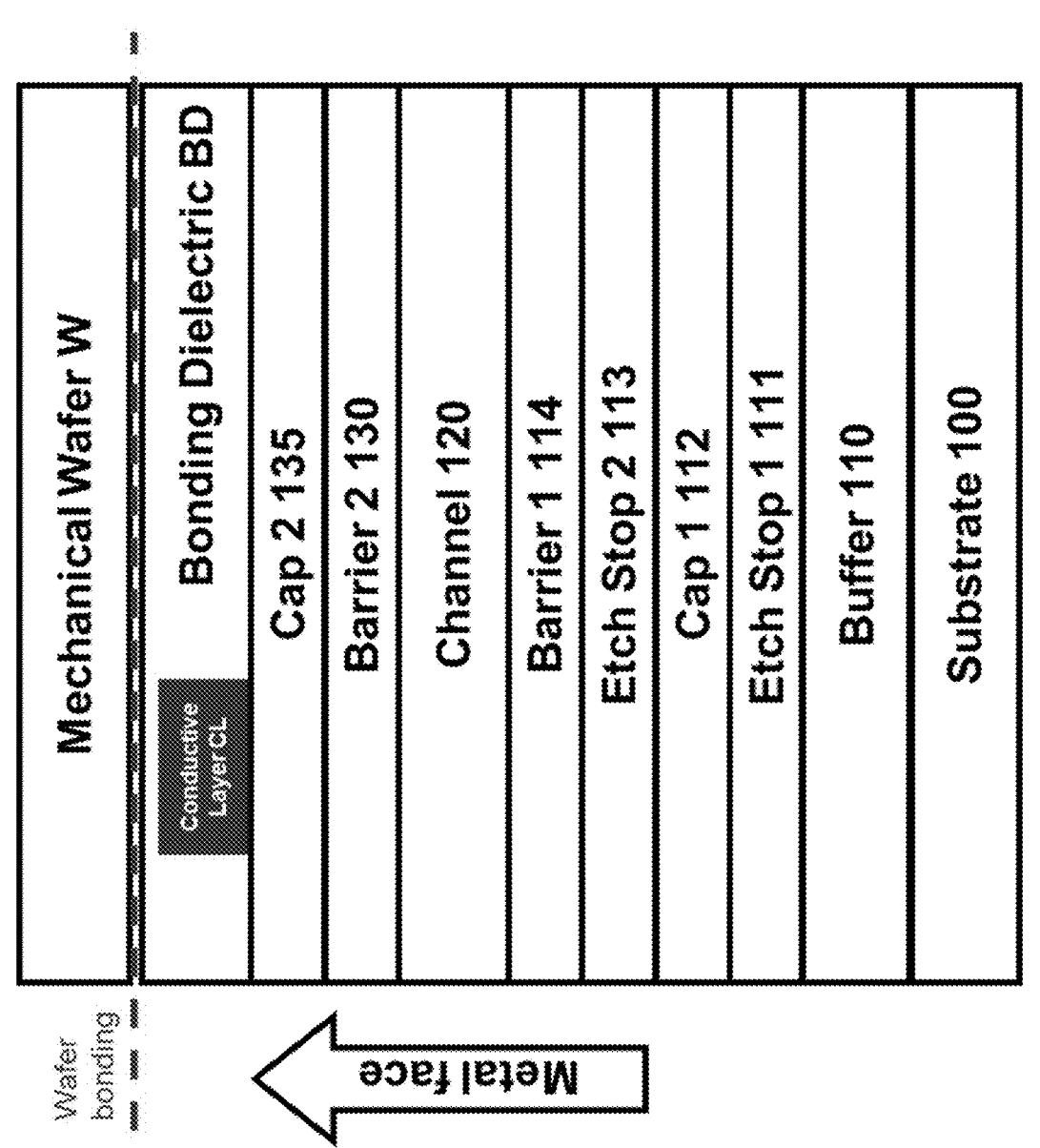
FIG. 20 depicts a mechanical wafer bonded to the bonding dielectric on the structure according to further embodiments of the inventive concept.
Figure 21:
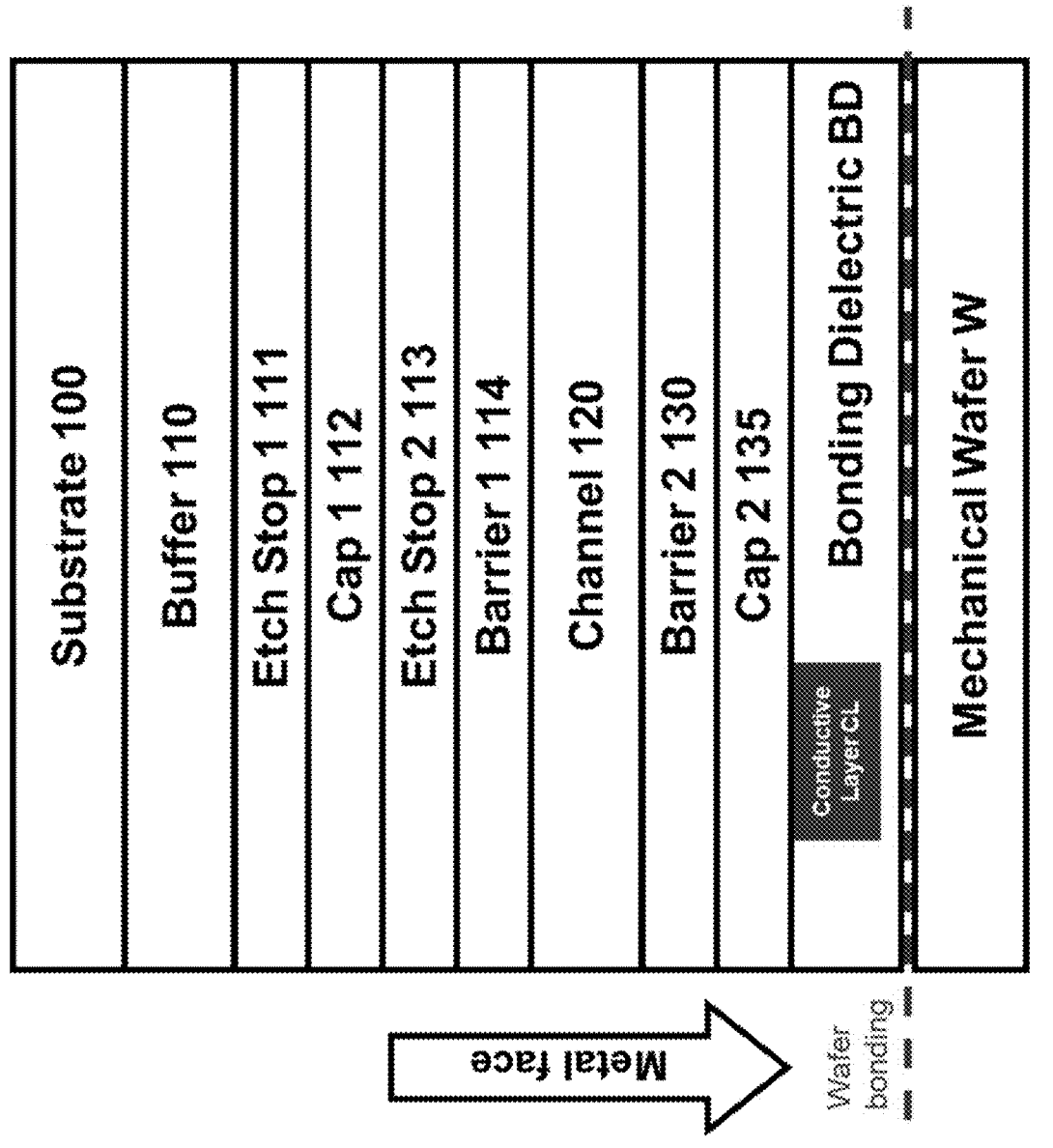
FIG. 21 depicts flipping of the structure including a bonding dielectric and mechanical wafer according to further embodiments of the inventive concept. The substrate, which was at the bottom of the structure, is now at that top of the structure.

Prior to removal of the substrate/buffer, in some embodiments, a bonding dielectric BD may then be formed/deposited on the top of the epitaxial structure/conductive layer CL, as shown in FIG. 19. The bonding dielectric may be of any suitable material for forming a bonding dielectric that would be appreciated by one of skill in the art. The bonding dielectric may be formed on the second cap layer 135/on the polarization charge-inducer/barrier layer 130, and on the conductive layer CL. Following formation/deposition of the bonding dielectric, a mechanical wafer W, e.g., a wafer of silicon, may be bonded to the bonding dielectric BD, as shown in FIG. 20. The bonding dielectric BD, the structure may be flipped, either after wafer bonding, i.e., flipping the structure shown in FIG. 20 to provide the structure as is shown in FIG. 21, or prior to wafer bonding, i.e., flipping the structure shown in FIG. 19, followed by bonding of mechanical wafer W to the bonding dielectric BD, to provide the structure shown in FIG. 21. After flipping the structure, the metal face, on which layers of the structure of the inventive concept are grown, is disposed on the bottom of the structure, and the conductive layer CL is disposed below the channel 120.

Figure 22:
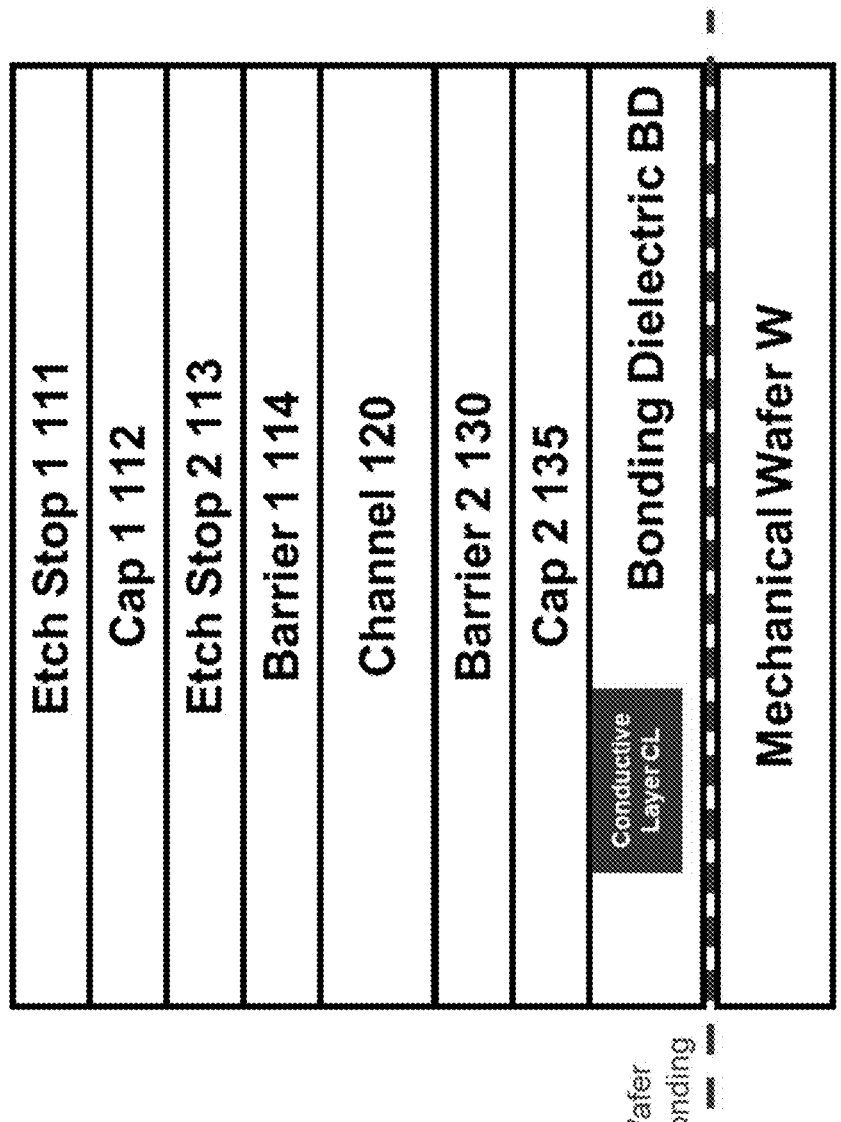
FIG. 22 depicts the structure after substrate/buffer removal according to further embodiments of the inventive concept, on which a transistor/top gate, shown extending to the second etch stop layer/on the channel, and source and drain electrodes extending into the channel may be formed by processing the top of the flipped epitaxial structure (bottom of the original epitaxial structure) after substrate/buffer removal shown in FIG. 22, to provide the completed device structure/transistor platform of the inventive concept as set forth in FIG. 23.
Figure 23:
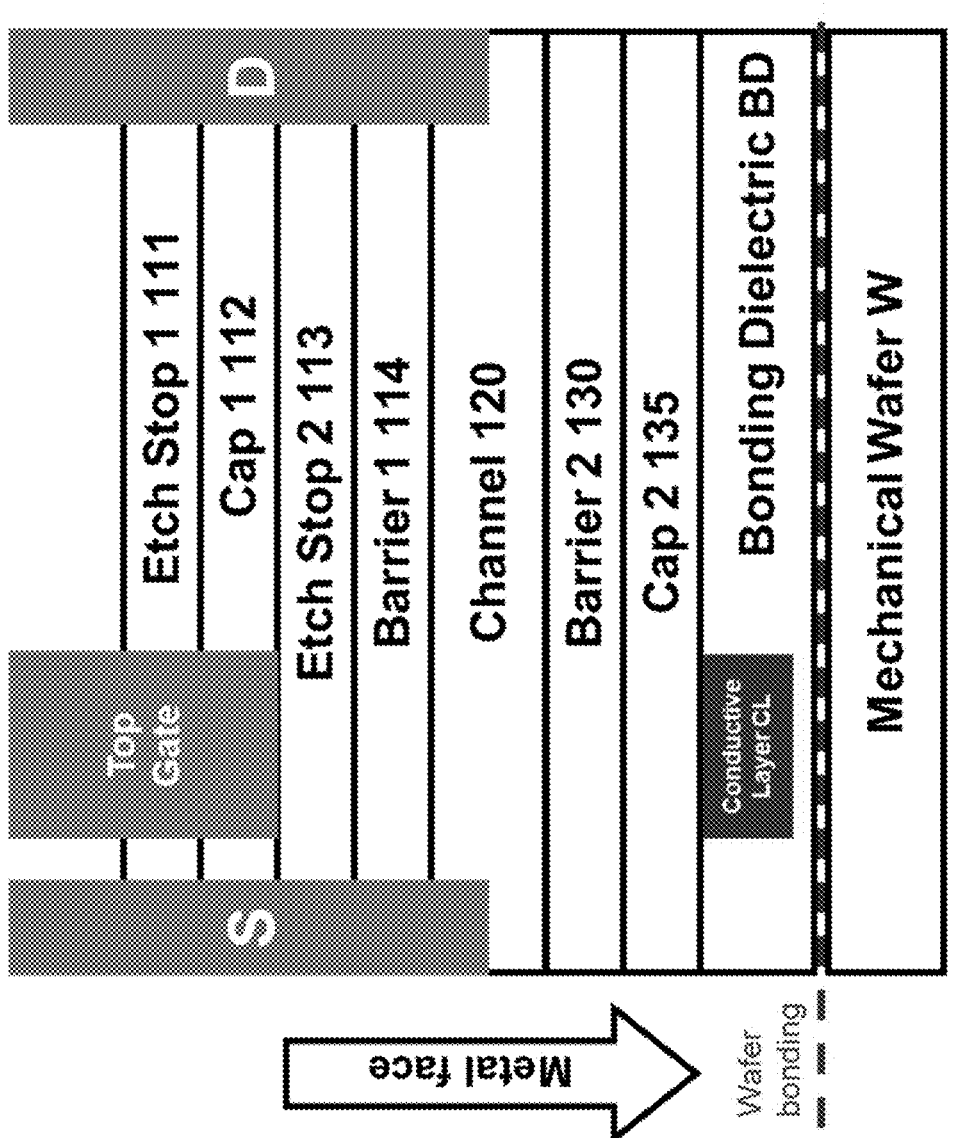
FIG. 23 presents an illustration of a completed device structure/transistor platform according to further embodiments of the inventive concept. Although a conductive layer, a bonding dielectric, mechanical wafer, transistor/top gate, and source/drain electrodes extending into the channel are depicted as part of the completed device structure/transistor platform, the presence of these elements is exemplary of the completed device structure, and not intended to be construed as being limiting of the scope of epitaxial structure of the inventive concept, e.g., as set forth in FIG. 17.

Following removal of the substrate/buffer from the structure shown in FIG. 21, a structure as shown in FIG. 22 is provided. Source and drain electrodes, S and D, respectively, may then be formed on opposing sides of the channel 120, and a gate electrode/top gate may be formed at the top of the channel to provide a completed device structure/transistor platform 2001 as shown in FIG. 23. The conductive layer CL may now serve as a backside metal below the channel as a result of flipping the structure, and may serve in different roles, for example, as a backgate, a field plate, and an electrode to deliver power to the devices and circuits, e.g., part of a backside power delivery network (BSPDN).

The foregoing is illustrative of embodiments of the inventive concept and is not to be construed as limiting thereof. Although some embodiments have been described, those skilled in the art will readily appreciate that many modifications are possible in embodiments without materially departing from the novel teachings and advantages of the inventive concept. Accordingly, all such modifications are intended to be included within the scope of the inventive concept as defined in the claims that follow.

The invention claimed is:

1. A method of forming an epitaxial structure comprising:
    forming a buffer layer on a substrate;
    forming a first etch stop layer on the buffer layer;
    forming a first cap layer on the first etch stop layer;
    forming a second etch stop layer on the first cap layer;
    forming a first polarization charge-inducer/barrier layer on the second etch stop layer;
    forming a channel on the first charge-inducer/barrier layer;
    forming a second polarization charge-inducer/barrier layer on the channel; and
    forming a second cap layer on the second polarization charge-inducer/barrier layer,
    wherein the buffer layer, first etch stop layer, first cap layer, second etch stop layer, first polarization charge-inducer/barrier layer, channel, second polarization charge-inducer/barrier layer, and second cap layer are grown in the metal/top face on top of the substrate, and:
    depositing and patterning a conductive layer on the second polarization charge-inducer/barrier layer;
    forming a bonding dielectric on the patterned conductive layer,
    to provide a structure wherein the bonding dielectric is at the top of the structure, followed by:
    orienting the structure so that the bonding dielectric and the patterned conductive layer are at the bottom of the structure, and the substrate is at the top of the structure;
    removing the substrate and buffer layer;
    forming source and drain electrodes on opposing sides of the channel; and
    forming a gate electrode/top gate on top of the channel,
    wherein at least one layer in the epitaxial structure is grown epitaxially, to provide the epitaxial structure.

2. The method of claim 1, further comprising bonding a mechanical wafer to the bonding dielectric before or after orienting the epitaxial structure so that the bonding dielectric and the patterned conductive layer are at the bottom of the structure.

3. The method of claim 1, wherein all the layers in the epitaxial structure are grown epitaxially on the substrate.

4. The method of claim 1, wherein the first polarization charge-inducer/barrier layer and the channel comprise different III-N semiconductor materials.

5. The method of claim 1, wherein the second polarization charge-inducer/barrier layer and the channel comprise different III-N semiconductor materials, and wherein the III-N semiconductor material of the second polarization charge-inducer/barrier layer has a greater band gap than that of the III-N semiconductor material of the channel.

6. The method of claim 1, wherein the first etch stop layer comprises a material that has an etching rate less than the etching rate of the substrate.

7. The method of claim 6, wherein the first etch stop layer comprises $Al_aGa_{1-a}N$, wherein the mole fraction a of Al is $0<a\leq1$.

8. The method of claim 1, wherein the second etch stop layer comprises a material that has an etching rate less than the etching rate of the first cap layer.

9. The method of claim 8, wherein the first etch stop layer comprises $Al_bGa_{1-b}N$, wherein the mole fraction a of Al is $0<b\leq1$.

10. The method of claim 1, wherein the second cap layer comprises a III-N semiconductor material or silicon nitride.

11. An epitaxial structure prepared by the method of claim 1.

12. A method of forming an epitaxial structure comprising:

a) forming a buffer layer on a substrate;

b) forming a channel on the buffer layer c) forming a polarization charge-inducer/barrier layer on the channel; wherein the buffer layer, channel, and polarization charge-inducer/barrier layer are grown in the metal/top face on top of the substrate, followed by:

d) depositing and patterning a conductive layer on the polarization charge-inducer/barrier layer;

e) forming a bonding dielectric on the patterned conductive, to provide a structure wherein the bonding dielectric is at the top of the structure, followed by:

f) orienting the epitaxial structure so that the bonding dielectric and the patterned conductive layer are at the bottom of the structure, and the substrate is at the top of the structure;

g) removing the substrate and buffer layer;

h) forming source and drain electrodes on opposing sides of the channel;

i) forming a gate electrode/top gate on top of the channel, wherein at least one layer in the epitaxial structure is grown epitaxially, to provide the epitaxial structure; and bonding a mechanical wafer to the bonding dielectric before or after orienting the epitaxial structure so that the bonding dielectric and the patterned conductive layer are at the bottom of the structure.

13. The method of claim 12, wherein all the layers in the epitaxial structure are grown epitaxially on the substrate.

\* \* \* \* \*